US012586827B2

(12) United States Patent
Lim

(10) Patent No.: US 12,586,827 B2
(45) Date of Patent: Mar. 24, 2026

(54) BATTERY MANAGEMENT APPARATUS, BATTERY MANAGEMENT METHOD AND BATTERY PACK

(71) Applicant: LG ENERGY SOLUTION, LTD., Seoul (KR)

(72) Inventor: Bo-Mi Lim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 881 days.

(21) Appl. No.: 17/640,416

(22) PCT Filed: Oct. 20, 2020

(86) PCT No.: PCT/KR2020/014353
§ 371 (c)(1),
(2) Date: Mar. 4, 2022

(87) PCT Pub. No.: WO2021/096087
PCT Pub. Date: May 20, 2021

(65) Prior Publication Data
US 2022/0344729 A1 Oct. 27, 2022

(30) Foreign Application Priority Data

Nov. 15, 2019 (KR) ........................ 10-2019-0147025

(51) Int. Cl.
*H01M 10/42* (2006.01)
*G01R 31/367* (2019.01)
(Continued)

(52) U.S. Cl.
CPC ........ *H01M 10/425* (2013.01); *G01R 31/367* (2019.01); *G06F 11/3447* (2013.01);
(Continued)

(58) Field of Classification Search
None
See application file for complete search history.

(56) References Cited

U.S. PATENT DOCUMENTS 10,243,923 B2 * 3/2019 Jo ........................ H04L 25/4902
11,449,381 B2 * 9/2022 Sung ..................... H04W 84/20
(Continued)

FOREIGN PATENT DOCUMENTS

CN 109143083 A 1/2019
JP 2010-281723 A 12/2010
(Continued)

OTHER PUBLICATIONS

Office Action dated May 9, 2023, issued in corresponding Japanese Patent Application No. 2022-514025.
(Continued)

*Primary Examiner* — Renee D Chavez
*Assistant Examiner* — Martin Khoi Hoang Vu
(74) *Attorney, Agent, or Firm* — Morgan, Lewis & Bockius LLP

(57) ABSTRACT

There are provided a battery management apparatus, a battery management method and a battery pack. The battery management apparatus sets at least one of a plurality of external variables as a valid external variable for each internal variable using a plurality of observational data sets associated with the external variables that can be observed outside a battery cell and a plurality of desired data sets associated with the internal variables that are unobservable outside the battery cell. The observational data set associated with respective valid external variable is used for the machine learning of sub-multilayer perceptron necessary to estimate respective internal variable.

18 Claims, 6 Drawing Sheets

(51) Int. Cl.

| | |
|---|---|
| *G06F 11/34* | (2006.01) |
| *H01M 10/44* | (2006.01) |
| *H01M 10/48* | (2006.01) |
| *H01M 50/574* | (2021.01) |
| *H02J 7/00* | (2006.01) |

(52) U.S. Cl.
   CPC ....... *H01M 10/443* (2013.01); *H01M 10/486* (2013.01); *H01M 50/574* (2021.01); *H02J 7/007* (2013.01); *H01M 2010/4271* (2013.01)

(56) References Cited

U.S. PATENT DOCUMENTS

| | | | |
|---|---|---|---|
| 2005/0194936 A1 | 9/2005 | Cho | |
| 2014/0049227 A1 | 2/2014 | Martin et al. | |
| 2016/0363632 A1 | 12/2016 | Park et al. | |
| 2017/0125853 A1 | 5/2017 | Song et al. | |
| 2018/0143257 A1 | 5/2018 | Garcia et al. | |
| 2018/0143259 A1* | 5/2018 | Kim | G01R 31/392 |
| 2019/0086478 A1 | 3/2019 | Park et al. | |
| 2019/0165432 A1 | 5/2019 | Park et al. | |
| 2019/0187212 A1* | 6/2019 | Garcia | G01R 31/382 |
| 2019/0257886 A1 | 8/2019 | Hooshmand et al. | |
| 2021/0286008 A1 | 9/2021 | Kim et al. | |

FOREIGN PATENT DOCUMENTS

| | | | |
|---|---|---|---|
| JP | 2014-167406 A | | 9/2014 |
| JP | 2015-135286 A | | 7/2015 |
| JP | 2015-172557 A | | 10/2015 |
| KR | 10-0651573 B1 | | 11/2006 |
| KR | 10-0712827 B1 | | 5/2007 |
| KR | 10-2013-0049920 A | | 5/2013 |
| KR | 10-2016-0146032 A | | 12/2016 |
| KR | 10-2017-0051008 A | | 5/2017 |
| KR | 10-2018-0057266 A | | 5/2018 |
| KR | 10-1992051 B1 | | 6/2019 |
| KR | 10-2019-0098531 A | | 8/2019 |

OTHER PUBLICATIONS

Guangxing Bai et al., "An internal state variable mapping approach for Li-Plating diagnosis," Journal of Power Sources, vol. 323, May 18, 2016, pp. 115-124.

Extended European Search Report dated Sep. 20, 2022, issued by the European Patent Office in corresponding European patent application No. 20888120.1.

International Search Report and Written Opinion issued in corresponding International Patent Application No. PCT/KR2020/014353 dated Jan. 27, 2021 (see partial English translation).

Office Action dated Jan. 23, 2025 issued in corresponding Chinese Patent Application No. 202080064683.0. (Note: US 2018/0143259 A1 and KR 10-2013-0049920 A cited in this CN Office Action were cited in prior IDSs.).

\* cited by examiner

BATTERY MANAGEMENT APPARATUS, BATTERY MANAGEMENT METHOD AND BATTERY PACK

TECHNICAL FIELD

The present disclosure relates to technology that analyzes a correlation between external variables and internal variables dependent on the internal chemical state of a battery cell.

The present application claims the benefit of Korean Patent Application No. 10-2019-0147025 filed on Nov. 15, 2019 with the Korean Intellectual Property Office, the disclosure of which is incorporated herein by reference in its entirety.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

A battery cell gradually degrades over time due to the repeated charging and discharging. As the battery cell degrades, the internal chemical state of the battery cell also changes. However, the internal variables (e.g., electrical conductivity of the positive electrode active material) indicating the internal chemical state the battery cell cannot be observed outside the battery cell.

Meanwhile, the internal chemical state of the battery cell causes a change in external variables (e.g., voltage and temperature of the battery cell) that can be observed outside the battery cell. Accordingly, there are attempts to estimate the internal variables based on the external variables.

However, some of the internal variables and some of the external variables may have a very low correlation. Thus, without considering the correlation between the internal variables and the external variables, the internal variables estimated using the external variables may be greatly different from the actual internal chemical state of the battery cell.

DISCLOSURE

Technical Problem

The present disclosure is designed to solve the above-described problem, and therefore the present disclosure is directed to providing a battery management apparatus, a battery management method, and a battery pack that analyzes a correlation between internal variables and external variables of a battery cell.

The present disclosure is further directed to providing a battery management apparatus, a battery management method and a battery pack, in which only external variables having at least a certain level of correlation with each internal variable are used in the modeling of a sub-multi-layer perceptron necessary for estimation of each internal variable.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

A battery management apparatus according to an aspect of the present disclosure includes a memory unit configured to store first to $p^{th}$ observational data sets and first to $n^{th}$ desired data sets, wherein each of p and n is an integer of 2 or greater, and a control unit operably coupled to the memory unit. The first to $p^{th}$ observational data sets are respectively associated with p external variables that are observable outside a battery cell. Each of the first to $p^{th}$ observational data sets includes a predetermined number of input values. The first to $n^{th}$ desired data sets are associated with first to $n^{th}$ internal variables, respectively, wherein the first to $n^{th}$ internal variables are dependent on an internal chemical state of the battery cell and are unobservable outside the battery cell. Each of the first to $n^{th}$ desired data sets includes the same number of target values as the predetermined number. The control unit is configured to set m observational data sets extracted by data filtering from the first to $p^{th}$ observational data sets as first to $m^{th}$ input data sets. m is an integer of 1 or greater and p or smaller. The control unit is configured to set at least one of the first to $m^{th}$ external variables as a valid external variable for each of the first to $n^{th}$ internal variables based on the first to $m^{th}$ input data sets and the first to $n^{th}$ desired data sets. The first to $m^{th}$ external variables are m external variables associated with the m observational data sets among the p external variables.

The control unit may be configured to determine a multiple correlation coefficient between the $q^{th}$ observational data set and the $(q+1)^{th}$ observational data set, when q is an integer of 1 to p−1. The control unit may be configured to set the $q^{th}$ observational data set as one of the first to $m^{th}$ input data sets when an absolute value of the multiple correlation coefficient is less than a predetermined filtering value.

The memory unit may be further configured to store a main multilayer perceptron that defines a correspondence relationship between the first to $m^{th}$ external variables and the first to $n^{th}$ internal variables. The control unit may be configured to acquire first to $n^{th}$ output data sets from first to $n^{th}$ output nodes included in an output layer of the main multilayer perceptron by providing the first to $m^{th}$ input data sets to first to $m^{th}$ input nodes included in an input layer of the main multilayer perceptron. Each of the first to $n^{th}$ output data sets may include the same number of result values as the predetermined number. The control unit may be configured to determine first to $n^{th}$ error factors based on the first to $n^{th}$ output data sets and the first to $n^{th}$ desired data sets. The control unit may be configured to determine first to $n^{th}$ reference values by comparing each of the first to $n^{th}$ error factors with a threshold error factor.

The control unit may be configured to determine a $j^{th}$ error factor to be equal to an error ratio of the $j^{th}$ output data set to the $j^{th}$ desired data set when j is an integer of 1 to n.

The control unit may be configured to set the $j^{th}$ reference value to be equal to a first predetermined value when the $j^{th}$ error factor is smaller than the threshold error factor. The control unit may be configured to set the $j^{th}$ reference value to be equal to a second predetermined value when the $j^{th}$ error factor is equal to or larger than the threshold error factor. The second predetermined value may be smaller than the first predetermined value.

The control unit may be configured to determine whether to set an $i^{th}$ external variable among the first to $m^{th}$ external variables as a valid external variable for the $j^{th}$ internal variable based on an $i^{th}$ input data set, a $j^{th}$ desired data set and a $j^{th}$ reference value, when i is an integer of 1 to m and j is an integer of 1 to n. The control unit may be configured to learn a sub-multilayer perceptron associated with the $j^{th}$ internal variable using the $i^{th}$ input data set as training data when the $i^{th}$ external variable is set as the valid external variable for the $j^{th}$ internal variable.

The control unit may be configured to determine a multiple correlation coefficient between the $i^{th}$ input data set and the $j^{th}$ desired data set. The control unit may be configured to set the $i^{th}$ external variable as the valid external variable for the $j^{th}$ internal variable when an absolute value of the multiple correlation coefficient is larger than the $j^{th}$ reference value.

The control unit may be configured to set the $i^{th}$ external variable as an invalid external variable for the $j^{th}$ internal variable when the absolute value of the multiple correlation coefficient is equal to or less than the $j^{th}$ reference value.

A battery pack according to another aspect of the present disclosure includes the battery management apparatus.

A battery management method according to still another aspect of the present disclosure includes storing first to $p^{th}$ observational data sets and first to $n^{th}$ desired data sets, wherein each of p and n is an integer of 2 or greater, the first to $p^{th}$ observational data sets are respectively associated with p external variables that are observable outside a battery cell, each of the first to $p^{th}$ observational data sets includes a predetermined number of input values, the first to $n^{th}$ desired data sets are respectively associated with first to $n^{th}$ internal variables that are unobservable outside the battery cell, the first to $n^{th}$ internal variables being dependent on an internal chemical state of the battery cell, and each of the first to $n^{th}$ desired data sets includes the predetermined number of target values, setting m observational data sets extracted by data filtering from the first to $p^{th}$ observational data sets as first to $m^{th}$ input data sets, wherein m is an integer of 1 or greater and p or smaller, and setting at least one of the first to $m^{th}$ external variables as a valid external variable for each of the first to $n^{th}$ internal variables based on the first to $m^{th}$ input data sets and the first to $n^{th}$ desired data sets. The first to $m^{th}$ external variables are m external variables associated with the m observational data sets among the p external variables.

Setting the m observational data sets as the first to $m^{th}$ input data sets includes determining a multiple correlation coefficient between the $q^{th}$ observational data set and the $(q+1)^{th}$ observational data set, when q is an integer of 1 to $p-1$, and setting the $q^{th}$ observational data set as one of the first to $m^{th}$ input data sets when an absolute value of the multiple correlation coefficient is less than a predetermined filtering value.

Advantageous Effects

According to at least one of the embodiments of the present disclosure, it is possible to analyze a correlation between internal variables and external variables of a battery cell.

According to at least one of the embodiments of the present disclosure, when a correlation between two external variables is equal to or larger than a predetermined level, only an observational data set for one of the two external variables is extracted, and the extracted observational data set may be used in the modeling of a sub-multilayer perceptron.

According to at least one of the embodiments of the present disclosure, only external variables having at least a certain level of correlation with each internal variable may be used in the modeling of a sub-multilayer perceptron necessary for estimation of each internal variable.

The effects of the present disclosure are not limited to the effects mentioned above, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

DETAILED DESCRIPTION

Figure 1:
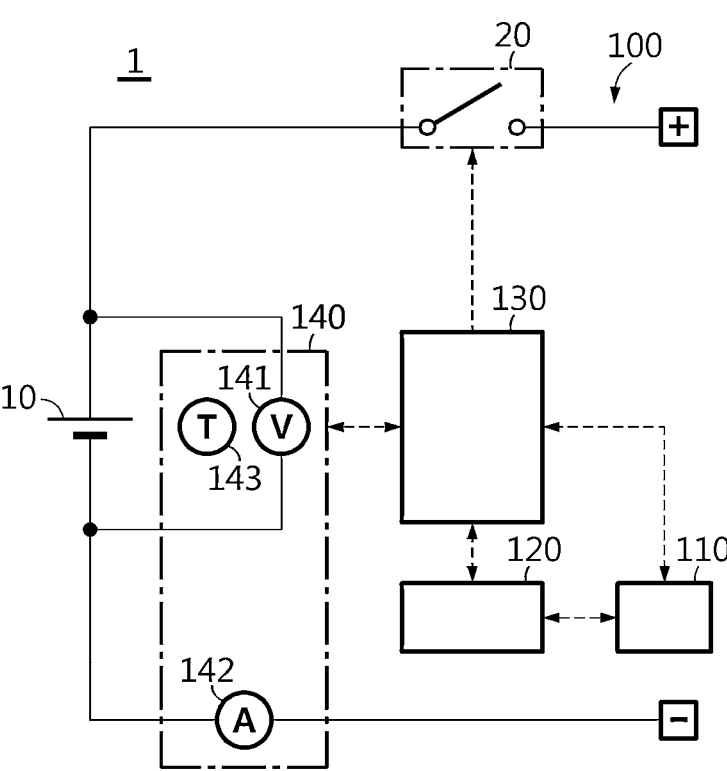
FIG. 1 is a diagram exemplarily showing a configuration of a battery pack including a battery management apparatus according to an embodiment of the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing unit of at least one function or operation, and this may be implemented by hardware and software either alone or in combination.

In addition, throughout the specification, it will be further understood that when an element is referred to as being "connected to" another element, it can be directly connected to the other element or intervening elements may be present.

Figure 2:
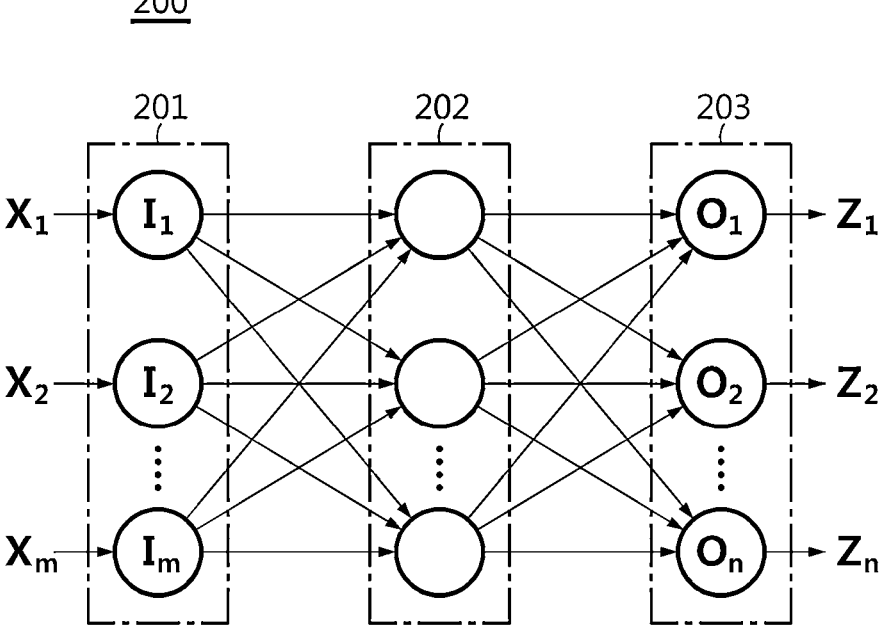
FIG. 2 is a diagram exemplarily showing a main multi-layer perceptron used by the battery management apparatus of FIG. 1.
Figure 3:
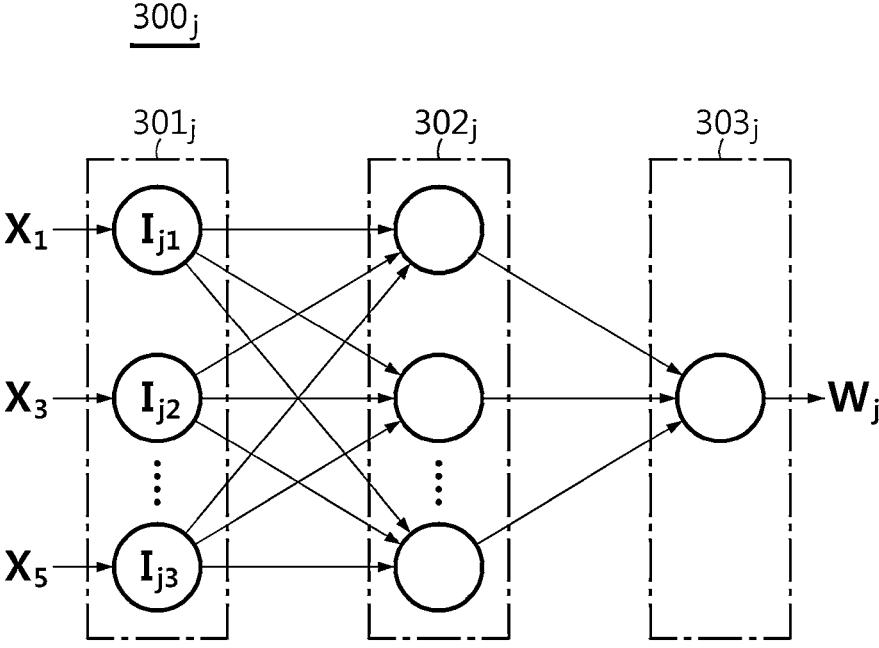
FIG. 3 is a diagram exemplarily showing a sub-multilayer perceptron.

FIG. 1 is a diagram exemplarily showing a configuration of a battery pack 1 including a battery management apparatus 100 according to the present disclosure, FIG. 2 is a diagram exemplarily showing a main multilayer perceptron used by the battery management apparatus 100 of FIG. 1, and FIG. 3 is a diagram exemplarily showing a sub-multilayer perceptron.

Referring to FIG. 1, the battery pack 1 includes a battery cell 10, a switch 20 and the battery management apparatus 100.

The battery pack 1 is mounted on an electricity-powered device such as an electric vehicle to supply electrical energy required to drive the electricity-powered device. The battery management apparatus 100 is provided to be electrically connected to positive and negative terminals of the battery cell 10.

The battery cell 10 may be a lithium ion cell. The battery cell 10 may include any type that can be repeatedly charged and discharged, and is not limited to the lithium ion cell.

The battery cell 10 may be electrically coupled to an external device through power terminals (+, −) of the battery pack 1. The external device may be, for example, an electrical load (e.g., a motor), a direct current (DC)-alternating current (AC) inverter and a charger of the electric vehicle.

The switch 20 is installed on a current path connecting the positive terminal of the battery cell 10 to the power terminal (+) or a current path connecting the negative terminal of the battery cell 10 to the power terminal (−). While the switch 20 is in an open operating state, the battery cell 10 stops charging and discharging. While the switch 20 is in a closed operating state, the battery cell 10 is allowed to charge and discharge.

The battery management apparatus 100 includes an interface unit 110, a memory unit 120 and a control unit 130. The battery management apparatus 100 may further include a sensing unit 140.

The sensing unit 140 includes a voltage sensor 141, a current sensor 142 and a temperature sensor 143. The voltage sensor 141 is configured to measure a voltage across the battery cell 10. The current sensor 142 is configured to measure an electric current flowing through the battery cell 10. The temperature sensor 143 is configured to measure a temperature of the battery cell 10. The sensing unit 140 may transmit sensing data indicating the measured voltage, the measured current, and the measured temperature to the control unit 130.

The interface unit 110 may be coupled to the external device to enable communication between. The external device may be, for example, a charging system, an electrical load and a mobile device. The interface unit 110 is configured to support wired communication or wireless communication between the control unit 130 and the external device. The wired communication may be, for example, controller area network (CAN) communication, and the wireless communication may be, for example, ZigBee or Bluetooth communication. The interface unit 110 may include an output device such as a display or a speaker to provide the results of each operation performed by the control unit 130 in a form that can be recognized by a user. The interface unit 110 may include an input device such as a mouse and a keyboard to receive data from the user.

The memory unit 120 is operably coupled to at least one of the interface unit 110, the control unit 130 or the sensing unit 140. The memory unit 120 may store the results of each operation performed by the control unit 130. The memory unit 120 may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM).

The memory unit 120 is configured to store various data required to estimate the internal chemical state of the battery cell 10. Specifically, the memory unit 120 stores a first number of observational data sets and a second number of desired data sets. For example, information including the first to $p^{th}$ observational data sets and the first to $n^{th}$ desired data sets is received from the external device by the interface unit 110. The memory unit 120 may further store the main multilayer perceptron. Hereinafter, it is assumed that p indicates the first number and is an integer of 2 or greater, and n indicates the second number and is an integer of 2 or greater.

The first to $p^{th}$ observational data sets are each associated with p external variables that are observable outside the battery cell 10. Each observational data set includes a predetermined third number (e.g., 10000) of input values. For example, the third number of input values for one of the p external variables are included in the $q^{th}$ observational data set. The control unit 130 is operably coupled to at least one of the interface unit 110, the memory unit 120 or the sensing unit 140. The control unit 130 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing other functions.

The control unit 130 extracts m observational data sets from the first to $p^{th}$ observational data sets through data filtering, and sets the m observational data sets as first to $m^{th}$ input data sets according to the extraction order. m is an integer of 1 or greater and p or smaller. A process of extracting the m observational data sets will be described below with reference to FIG. 4.

In the specification, $X_i$ denotes the $i^{th}$ input data set associated with the $i^{th}$ external variable, and $X_i(k)$ denotes the $k^{th}$ input value of the $i^{th}$ input data set.

For example, when m=16, the first to sixteenth external variables may be defined as follows.

The first external variable may indicate the period of time from the time point when the state of charge (SOC) of the battery cell 10 is equal to a first SOC (e.g., 100%) to the time point when the voltage of the battery cell 10 reaches a first voltage (e.g., 3.0 V) by a first test of discharging the battery cell 10 with a current of a first current rate (e.g., ⅓ C) at a first temperature.

The second external variable may indicate the voltage of the battery cell 10 at a time point when a second test is performed for a first reference time (e.g., 0.1 sec), the second test of discharging the battery cell 10 with a current of a second current rate (e.g., 200 A) at a second temperature from the time point when the SOC of the battery cell 10 is equal to a second SOC (e.g., 50%).

The third external variable may indicate the voltage of the battery cell 10 at the time point when the second test is performed for a second reference time (e.g., 1.0 sec) that is longer than the first reference time.

The fourth external variable may indicate the voltage of the battery cell 10 at the time point when the second test is performed for a third reference time (e.g., 10.0 sec) that is longer than the second reference time.

The fifth external variable may indicate the voltage of the battery cell 10 at the time point when the second test is performed for a fourth reference time (e.g., 30.0 sec) that is longer than the third reference time.

The sixth external variable may include the period of time from the time point when the SOC of the battery cell 10 is equal to a third SOC (e.g., 100%) to the time point when the voltage of the battery cell 10 reaches a second voltage (e.g., 3.8 V) by a third test of discharging the battery cell 10 with a current of a third current rate (e.g., 1.0 C) at a third temperature.

The seventh external variable may indicate the period of time until the time point when the voltage of the battery cell 10 reaches a third voltage (e.g., 3.5 V) that is lower than the second voltage by the third test.

The eighth external variable may represent the time taken for the voltage of the battery cell 10 to reduce from the second voltage to the third voltage by the third test.

The ninth external variable may indicate the voltage of the battery cell 10 at the time point when a fourth test of discharging the battery cell 10 with a current of a fourth current rate (e.g., 1.0 C) at a fourth temperature is performed for a fifth reference time (e.g., 0.1 sec) from the time point when the SOC of the battery cell 10 is equal to a fourth SOC (e.g., 10%).

The tenth external variable may indicate the voltage of the battery cell 10 at the time point when the fourth test is performed for a sixth reference time (e.g., 1.0 sec) that is longer than the fifth reference time.

The eleventh external variable may indicate the voltage of the battery cell 10 at the time point when the fourth test is performed for a seventh reference time (e.g., 10.0 sec) that is longer than the sixth reference time.

The twelfth external variable may indicate the voltage of the battery cell 10 at the time point when the fourth test is performed for an eighth reference time (e.g., 30.0 sec) that is longer than the seventh reference time.

The thirteenth external variable may indicate the voltage of the battery cell 10 at the time point when the fourth test is performed for a ninth reference time (e.g., 100.0 sec) that is longer than the eighth reference time.

The fourteenth external variable may indicate a ratio between a voltage change of the battery cell 10 during a first period (e.g., 0.0 to 0.1 sec) and a voltage change of the battery cell 10 during a second period (e.g., 20.0 to 20.1 sec) by a fifth test of charging the battery cell 10 with a current of a fifth current rate (e.g., 1.0 C) at a fifth temperature from the time point when the SOC of the battery cell 10 is equal to a fifth state (e.g., 10%).

The fifteenth external variable may indicate the voltage of the first peak on a differential capacity curve of the battery cell 10 obtained by a sixth test of charging the battery cell 10 with a current of a sixth current rate (e.g., 0.04 C) at a sixth temperature from the time point when the SOC of the battery cell 10 is equal to a sixth SOC (e.g., 0%). When V, dV and dQ are the voltage of the battery cell 10, the voltage change of the battery cell 10, and the capacity change of the battery cell 10, respectively, the differential capacity curve shows a correspondence relationship between V and dQ/dV. The differential capacity curve may be referred to as 'V-dQ/dV curve'. The first peak may be a peak having the smallest V among a plurality of peaks on the differential capacity curve.

The sixteenth external variable may indicate a difference between the voltage of the first peak and a reference voltage. The reference voltage is the voltage of the first peak of the differential capacity curve obtained when the battery cell 10 is at Beginning Of Life (BOL), and may be preset.

The first to $n^{th}$ desired data sets are associated with the first to $n^{th}$ internal variables that are unobservable outside the battery cell 10, respectively. That is, when a second index j is an integer of 1 to n, the $j^{th}$ desired data set is associated with the $j^{th}$ internal variable. Each internal variable indicates the internal chemical state of the battery cell 10. Each desired data set includes the same number of target values as the third number. For example, the third number of values preset as the $j^{th}$ internal variable are included in the $j^{th}$ desired data set.

In the specification, $Y_j$ denotes the $j^{th}$ desired data set, and $Y_j(k)$ denotes the $k^{th}$ target value of the $j^{th}$ desired data set.

$Y_1(k)$ to $Y_n(k)$ are the expected values for the first to $n^{th}$ internal variables when the battery cell 10 has a particular degradation state. $X_1(k)$ to $X_m(k)$ are the expected values for the first to $m^{th}$ external variables dependent on $Y_1(k)$ to $Y_n(k)$ when the battery cell 10 has the particular degradation state.

The degradation state of the battery cell 10 changes depending on the environment in which the battery cell 10 is used, and each degradation state may be defined by a combination of the first to $n^{th}$ internal variables. When a≠b, $X_1(a)$ to $X_m(a)$ and $Y_1(a)$ to $Y_n(a)$ are associated with 'a' degradation state, and $X_1(b)$ to $X_m(b)$ and $Y_1(b)$ to $Y_n(b)$ are associated with 'b' degradation state that is different from the 'a' degradation state of the battery cell 10.

For example, when n=14, the first to fourteenth internal variables may be defined as follows.

The first internal variable may be the electrical conductivity of the positive electrode of the battery cell 10.

The second internal variable may be the ionic diffusivity of the positive electrode active material of the battery cell 10.

The third internal variable may be the rate constant of the exchange current density of the positive electrode active material of the battery cell 10.

The fourth internal variable may be the ionic diffusivity of the negative active material of the battery cell 10.

The fifth internal variable may be the rate constant of the exchange current density of the negative active material of the battery cell 10.

The sixth internal variable may be the tortuosity of the negative electrode of the battery cell 10. The tortuosity is the ratio of the distance an ion travels from one point to another to the straight-line distance between the same two points.

The seventh internal variable may be the porosity of the negative electrode of the battery cell 10.

The eighth internal variable may be the ion concentration of the electrolyte of the battery cell 10.

The ninth internal variable may be the scale factor by which the initial ionic conductivity of the electrolyte of the battery cell 10 is multiplied. The initial ionic conductivity may be a preset value indicating the ionic conductivity of the electrolyte of the battery cell 10 when the battery cell 10 is at BOL.

The tenth internal variable may be the scale factor by which the initial ionic diffusivity of the electrolyte of the battery cell 10 is multiplied. The initial ionic diffusivity may be a preset value indicating the ionic diffusivity of the electrolyte of the battery cell 10 when the battery cell 10 is at BOL.

The eleventh internal variable may be the cation transference number of the electrolyte of the battery cell 10. The transference number indicates the fractional contribution of cations (e.g., Li+) to the electrical conductivity of the electrolyte.

The twelfth internal variable may be the Loss of Lithium Inventory (LLI) of the battery cell 10. The LLI indicates the loss of lithium in the battery cell 10 compared to BOL.

The thirteenth internal variable may be the Loss of Active Material (LAM) of the positive electrode of the battery cell 10. The LAM of the positive electrode indicates the loss of the positive electrode active material of the battery compared to the BOL.

The fourteenth internal variable may be the LAM of the negative electrode of the battery cell 10. The LAM of the negative electrode indicates the loss of the negative electrode active material of the battery compared to BOL.

The first to $m^{th}$ input data sets and the first to $n^{th}$ desired data sets may be preset from the simulation results of a plurality of battery cells having the same electrochemical specifications as the battery cell 10, but different degradation states.

The control unit 130 may determine first to $n^{th}$ reference values required for the modeling of the first to $n^{th}$ sub-multilayer perceptrons using the main multilayer perceptron 200 stored in the memory unit 120.

Referring to FIG. 2, the main multilayer perceptron 200 includes an input layer 201, a predetermined number of intermediate layers 202 and an output layer 203. In the main multilayer perceptron 200, the number of nodes (also referred to as 'neurons') included in each layer, connections between nodes and functions of each node included in each intermediate layer may be preset. Weights for each connection may be set using predefined training data.

The input layer 201 includes first to $m^{th}$ input nodes $I_1$ to $I_m$. The first to $m^{th}$ input nodes $I_1$ to $I_m$, are associated with the first to $m^{th}$ external variables, respectively. Each input value included in the $i^{th}$ input data set $X_i$ is provided to the $i^{th}$ input node $I_i$.

The output layer 203 includes first to $n^{th}$ output nodes $O_1$ to $O_n$. The first to $n^{th}$ output nodes $O_1$ to $O_n$ are associated with the first to $n^{th}$ internal variables, respectively.

When the $k^{th}$ input value of each of the first to $m^{th}$ input data sets $X_1$ to $X_m$ is input to the first to $m^{th}$ input nodes $I_1$ to $I_m$, respectively, the $k^{th}$ result value of each of the first to $n^{th}$ output data sets $Z_1$ to $Z_n$ is output from the first to $n^{th}$ output nodes $O_1$ to $O_n$, respectively.

The control unit 130 may generate first to $n^{th}$ output data sets $Z_1$ to $Z_n$, each having the same number of result values as the third number by repeating the process of inputting m input values (e.g., $X_1(k)$ to $X_m(k)$) of the same order in the first to $m^{th}$ input data sets $X_1$ to $X_m$ to the first to $m^{th}$ input nodes $I_1$ to $I_m$, respectively. In the specification, $Z_j$ denotes the $j^{th}$ output data set, and $Z_j(k)$ denotes the $k^{th}$ result value of the $j^{th}$ output data set. In the first to $n^{th}$ output data sets, n result values $Z_1(k)$ to $Z_n(k)$ may be arranged in the same order.

The control unit 130 may determine first to $n^{th}$ error factors based on the first to $n^{th}$ output data sets and the first to $n^{th}$ desired data sets. That is, the control unit 130 may determine the $j^{th}$ error factor by comparing the $j^{th}$ output data set with the $j^{th}$ desired data set. Specifically, the control unit 130 may determine the $j^{th}$ error factor using the following Equation 1.

$$F_{error\_j} = \sum_{k=0}^{u} \left| \frac{Y_j(k) - Z_j(k)}{Y_j(k)} \right| \times 100\,(\%) \qquad \langle\text{Equation 1}\rangle$$

In Equation 1, u is the third number, and $F_{error\_j}$ is the $j^{th}$ error factor. That is, the $j^{th}$ error factor may be determined to be equal to an error ratio of the $j^{th}$ output data set to the $j^{th}$ desired data set.

The control unit 130 may determine the first to $n^{th}$ reference values by comparing each of the first to $n^{th}$ error factors with a threshold error factor. The threshold error factor may be a preset value, for example, 3%. Specifically, when the $j^{th}$ error factor is smaller than the threshold error factor, the control unit 130 may determine the $j^{th}$ reference value to be equal to a first predetermined value. On the contrary, when the $j^{th}$ error factor is equal to or larger than the threshold error factor, the control unit 130 may determine the $j^{th}$ reference value to be equal to a second predetermined value. The second predetermined value (e.g., 0.25) may be smaller than the first predetermined value (e.g., 0.50). After determining the first to $n^{th}$ reference values, the process using the main multilayer perceptron 200 may be completed. Alternatively, each of the first to $n^{th}$ reference values may be preset to the first predetermined value or the second predetermined value. In this case, the process using the main multilayer perceptron 200 may be omitted.

The control unit 130 performs the process for determining the first to $n^{th}$ sub-multilayer perceptrons.

The control unit 130 determines a multiple correlation coefficient between each of the first to $n^{th}$ desired data sets and each of the first to $m^{th}$ input data sets. The multiple correlation coefficient between the $i^{th}$ input data set and the $j^{th}$ desired data set may be determined from the following Equation 2.

$$r_{i,j} = \frac{\sum_{k=1}^{N} X_i(k)Y_j(k) - \frac{\sum_{k=1}^{N} X_i(k)\sum_{k=1}^{N} Y_j(k)}{(N)}}{\sqrt{\sum_{k=1}^{N} X_i(k)^2 - \frac{\left(\sum_{k=1}^{N} X_i(k)\right)^2}{N}} \sqrt{\sum_{k=1}^{N} Y_j(k)^2 - \frac{\left(\sum_{k=1}^{N} Y_j(k)\right)^2}{N}}} \qquad \langle\text{Equation 2}\rangle$$

In Equation 2, N is the third number, and $r_{i,j}$ is the multiple correlation coefficient between the $i^{th}$ input data set and the $i^{th}$ desired data set. As m multiple correlation coefficients are determined for respective desired data set, a total of m×n multiple correlation coefficients may be determined.

The absolute value of the multiple correlation coefficient $r_{i,j}$ that is larger than the $j^{th}$ reference value indicates a high correlation between the $i^{th}$ external variable and the $j^{th}$ internal variable. When the absolute value of the multiple correlation coefficient rid is larger than the $j^{th}$ reference value, the control unit 130 may determine to use the $i^{th}$ input data set for the modeling of the $j^{th}$ sub-multilayer perceptron. When the absolute value of the multiple correlation coefficient $r_{i,j}$ is larger than the $j^{th}$ reference value, the control unit 130 may set the $i^{th}$ external variable as a valid external variable for the $j^{th}$ internal variable.

On the contrary, the absolute value of the multiple correlation coefficient rid that is equal to or less than the $j^{th}$ reference value indicates a low correlation between the $i^{th}$ external variable and the $j^{th}$ internal variable. When the absolute value of the multiple correlation coefficient $r_{i,j}$ is equal to or less than the $j^{th}$ reference value, the control unit 130 may determine not to use the $i^{th}$ input data set for the modeling of the $j^{th}$ sub-multilayer perceptron. That is, the control unit 130 may exclude the $i^{th}$ external variable from a valid external variable for the $j^{th}$ internal variable.

The control unit 130 may generate the first to $n^{th}$ sub-multilayer perceptrons associated with the first to $n^{th}$ internal variables, respectively. That is, the $j^{th}$ internal variable and the $j^{th}$ sub-multilayer perceptron are associated with each other. The $j^{th}$ sub-multilayer perceptron is used to estimate a value of the $j^{th}$ internal variable.

Referring to FIG. 3, the $j^{th}$ sub-multilayer perceptron 300$_j$ includes an input layer 301$_j$, a predetermined number of intermediate layers 302$_j$ and an output layer 303$_j$. The function of each node included in each intermediate layer 302$_j$ may be preset. The output layer 303 has a single output node associated with the $j^{th}$ internal variable.

The control unit 130 may generate the same number of input nodes of the input layer 301 of the $j^{th}$ sub-multilayer perceptron as the number of valid external variables sets for the $j^{th}$ internal variable. FIG. 3 exemplarily shows that each of the first, third, and fifth external variables is set as the valid external variable for the $j^{th}$ internal variable.

The input layer 301 of the $j^{th}$ sub-multilayer perceptron has three input nodes $I_{j1}$ to $I_{j3}$. The first, third and fifth input data sets respectively associated with the three external variables are provided as training data to each of the three input nodes $I_{j1}$ to $I_{j3}$, and learning of the $j^{th}$ sub-multilayer perceptron 300$_j$ is performed through comparison between the result values of the data set $W_j$ obtained from the output layer 303 of the $j^{th}$ sub-multilayer perceptron and the target values of the $j^{th}$ desired data set.

After the learning of the $j^{th}$ sub-multilayer perceptron 300$_j$ is completed, the control unit 130 may measure the voltage, the current and the temperature of the battery cell 10 using the sensing unit 140. The control unit 130 may determine values of three external variables based on the sensing data from the sensing unit 140. Subsequently, the control unit 130 may obtain a result value in the output layer 303$_j$ of the $j^{th}$ sub-multilayer perceptron 300$_j$ by inputting the values of the three external variables to the three input nodes $I_{j1}$ to $I_{j3}$ of the $j^{th}$ sub-multilayer perceptron 300$_j$, respectively. The corresponding result value is an estimated value of the $j^{th}$ internal variable associated with the degradation state corresponding to the values of the three external variables. When the estimated value of the $j^{th}$ internal variable is outside of a predetermined $j^{th}$ safety range, the control unit 130 may control the switch 20 into the open operating state to protect the battery cell 10.

Figure 4:
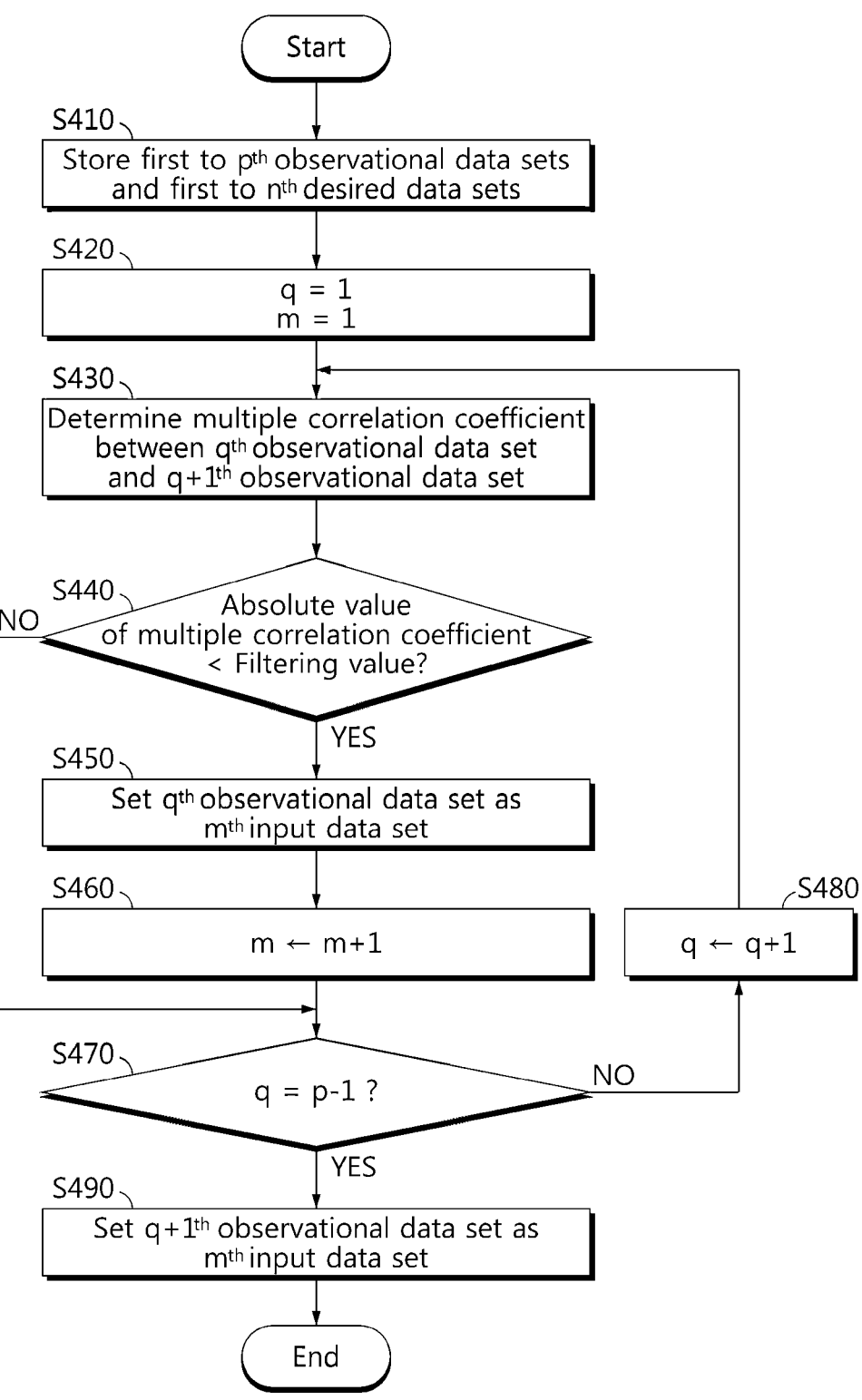
FIG. 4 is a flowchart exemplarily showing a first method that may be performed by the battery management apparatus of FIG. 1.

FIG. 4 is a flowchart exemplarily showing a first method that may be performed by the battery management apparatus 100 of FIG. 1. The first method according to FIG. 4 is a data filtering method for extracting at least one of the first to $p^{th}$ observational data sets as an input data set.

Referring to FIGS. 1 to 4, in step S410, the control unit 130 stores first to $p^{th}$ observational data sets and first to $n^{th}$ desired data sets in the memory unit 120.

In step S420, the control unit 130 sets each of the first index q and the second index m to 1.

In step S430, the control unit 130 determines a multiple correlation coefficient between the $q^{th}$ observational data set and the $(q+1)^{th}$ observational data set. For example, where q=1, the multiple correlation coefficient between the first observational data set and the second observational data set is determined. The multiple correlation coefficient between the $q^{th}$ observational data set and the $(q+1)^{th}$ observational data set may be determined from the following Equation 3. In the specification, $P_q$ denotes the $q^{th}$ observational data set.

$$R_{q,q+1} = \frac{\sum_{k=1}^{N} P_q(k)P_{q+1}(k) - \frac{\sum_{k=1}^{N} P_q(k)\sum_{k=1}^{N} P_{q+1}(k)}{N}}{\sqrt{\sum_{k=1}^{N} P_q(k)^2 - \frac{\left(\sum_{k=1}^{N} P_q(k)\right)^2}{N}}\sqrt{\sum_{k=1}^{N} P_{q+1}(k)^2 - \frac{\left(\sum_{k=1}^{N} P_{q+1}(k)\right)^2}{N}}} \qquad \langle\text{Equation 3}\rangle$$

In Equation 3, N is the third number, $P_q(k)$ is the $k^{th}$ input value of the $q^{th}$ observational data set, $P_{q+1}(k)$ is the $k^{th}$ input value of the $(q+1)^{th}$ observational data set, and $R_{q,q+1}$ is the multiple correlation coefficient between the $q^{th}$ observational data set and the $q+1^{th}$ observational data set.

In step S440, the control unit 130 determines whether the absolute value of the multiple correlation coefficient $R_{q,q+1}$ is less than a predetermined filtering value (for example, 0.75). A value of the step S440 being "Yes" represents that the correlation between the $q^{th}$ observational data set and the $(q+1)^{th}$ observational data set is not sufficiently high. Accordingly, it is very necessary to set the $q^{th}$ observational data set as the input data set. When the value of the step S440 is "Yes", step S450 is performed. On the contrary, the value of the step S440 being "No" represents that the correlation between the $q^{th}$ observational data set and the $(q+1)^{th}$ observational data set is sufficiently high. Accordingly, the need for set the $q^{th}$ observational data set as the input data set is low. When the value of the step S440 is "No", step S470 is performed.

In step S450, the control unit 130 sets the $q^{th}$ observational data set as the $m^{th}$ input data set. In an example, where q=1, m=1, the first input data set is equal to the first observational data set. In another example, where q=3, m=2, the second input data set is equal to the third observational data set.

In step S460, the control unit 130 increases the second index m by 1.

In step S470, the control unit 130 determines whether the first index q is equal to p−1. p is the number of observational data sets. When a value of the step S470 is "No", step S480 is performed. When the value of the step S470 is "Yes", step S490 is performed.

In step S490, the control unit 130 sets the $(q+1)^{th}$ observational data set as the $m^{th}$ input data set. By the step S490, among the first to $p^{th}$ observational data sets, at least the $p^{th}$ observational data set is set as the input data set.

By the steps S430~S450 of FIG. 4, when the two observational data sets have a strong correlation, only one of them is extracted as the input data set. Compared to the case in which all observational data sets are used as input data sets without exception, it is possible to reduce the amount of computation required for the modeling of the first to $n^{th}$ sub-multilayer perceptrons and increase the computation rate.

Figure 5:
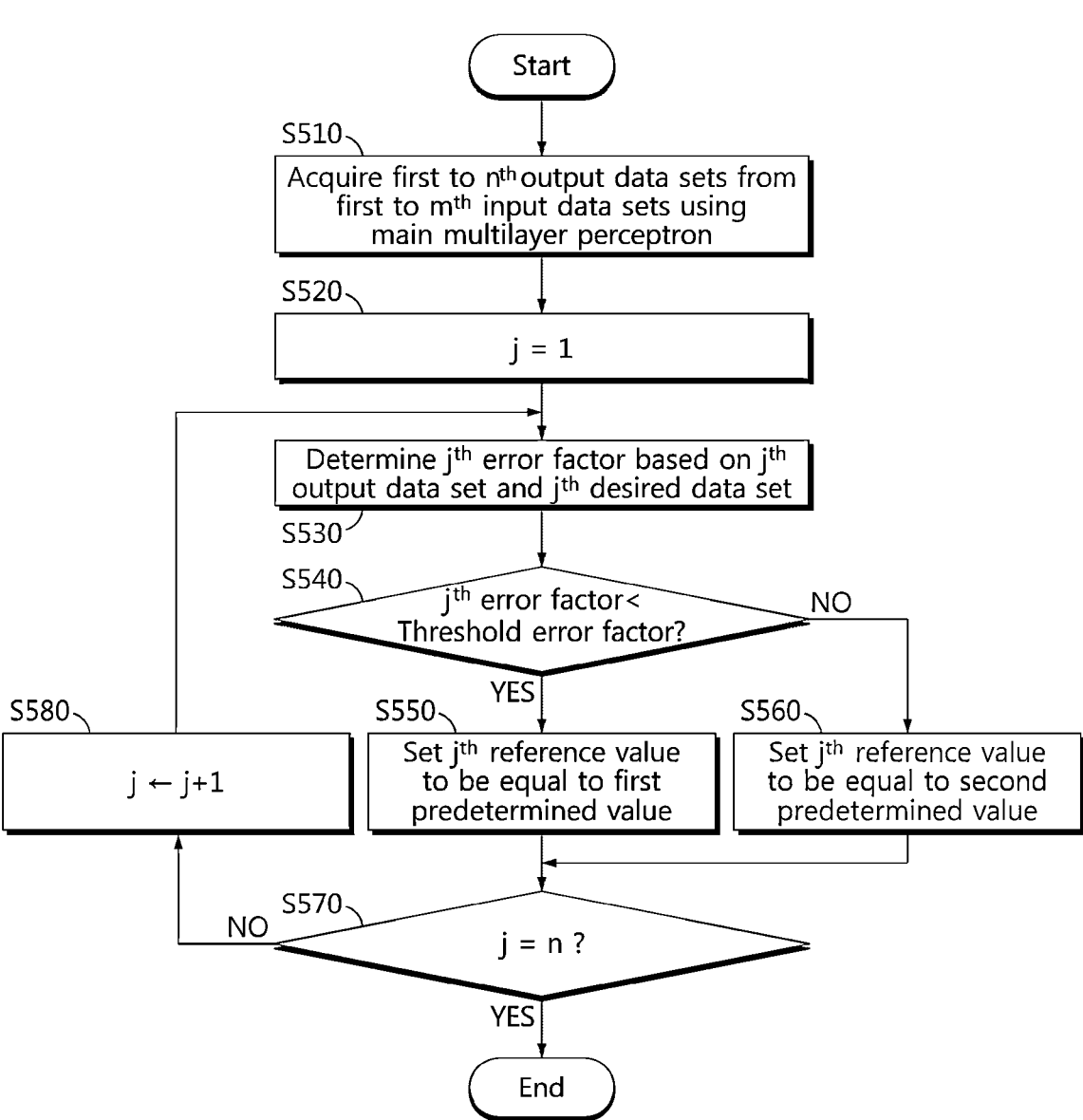
FIG. 5 is a flowchart exemplarily showing a second method that may be performed by the battery management apparatus of FIG. 1.

After the first to $m^{th}$ input data sets are determined by the method of FIG. 4, the control unit 130 may perform the method of FIG. 5. Alternatively, the control unit 130 may use the first to $p^{th}$ observational data sets as the first to $m^{th}$ input data sets without performing the method according to FIG. 4, and in this case, p=m.

FIG. 5 is a flowchart exemplarily showing a second method that may be performed by the battery management apparatus 100 of FIG. 1.

Referring to FIGS. 1 to 5, in step S510, the control unit 130 acquires first to $n^{th}$ output data sets from first to $m^{th}$ input data sets using the main multilayer perceptron 200.

In step S520, the control unit 130 sets the third index j to 1.

In step S530, the control unit 130 determines the $j^{th}$ error factor based on the $j^{th}$ output data set and the $j^{th}$ desired data set.

In step S540, the control unit 130 determines whether the $j^{th}$ error factor is less than the threshold error factor. When a value of the step S540 is "Yes", step S550 is performed. When the value of the step S540 is "No", step S560 is performed.

In step S550, the control unit 130 sets the $j^{th}$ reference value to be equal to the first predetermined value.

In step S560, the control unit 130 sets the $j^{th}$ reference value to be equal to the second predetermined value.

In step S570, the control unit 130 determines whether the third index j is equal to n. n is the number of desired data sets. When a value of the step S570 is "No", step S580 is performed.

In step S580, the control unit 130 increases the second index j by 1. After the step S580, the process returns to the step S530.

Figure 6:
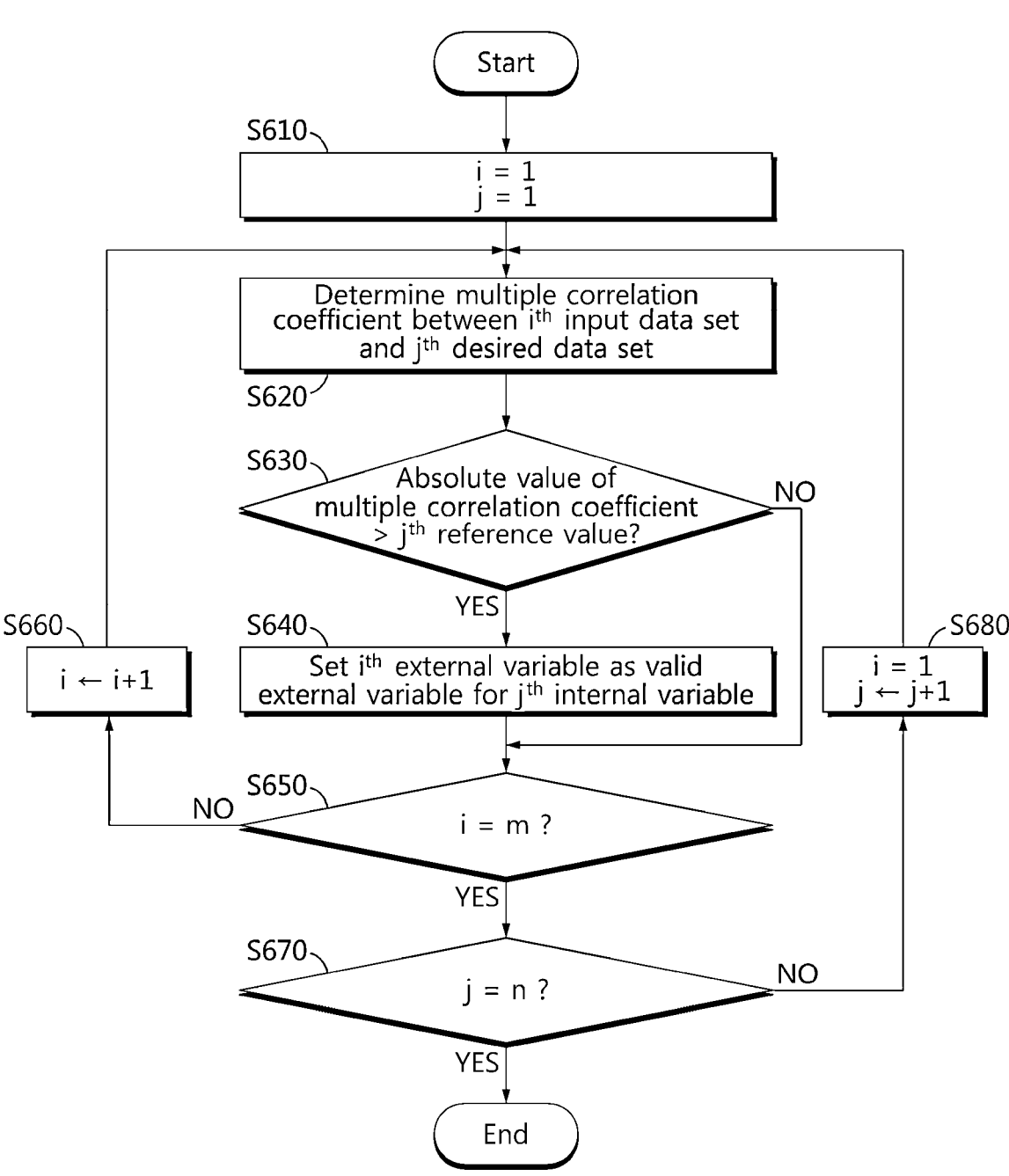
FIG. 6 is a flowchart exemplarily showing a third method that may be performed by the battery management apparatus of FIG. 1.

After the first to $n^{th}$ reference values are determined by the method of FIG. 5, the control unit 130 may perform the method of FIG. 6. Alternatively, when the first to $n^{th}$ reference values are preset and stored in the memory unit 120 as described above, the control unit 130 may perform the method of FIG. 6 without performing the method of FIG. 5.

FIG. 6 is a flowchart exemplarily showing a third method that may be performed by the battery management apparatus 100 of FIG. 1. The third method according to FIG. 6 may be a data filtering method for extracting an input data set used for machine learning of each sub-multilayer perceptron from the first to $m^{th}$ input data sets.

Referring to FIGS. 1 to 6, in step S610, the control unit 130 sets each of the third index j and a fourth index i to 1.

In step S620, the control unit 130 determines a multiple correlation coefficient between the $i^{th}$ input data set and the $j^{th}$ desired data set.

In step S630, the control unit 130 determines whether the absolute value of the multiple correlation coefficient is larger than the $j^{th}$ reference value. When a value of the step S630 is "Yes", step S640 is performed. When the value of the step S630 is "No", step S650 is performed.

In step S640, the control unit 130 sets the $i^{th}$ external variable as a valid external variable for the $j^{th}$ internal variable.

In step S650, the control unit 130 determines whether the fourth index i is equal to m. m is the number of input data sets. When a value of the step S650 is "No", step S660 is performed. When the value of the step S650 is "Yes", step S670 is performed.

In step S660, the control unit 130 increases the fourth index i by 1. After the step S660, the process returns to the step S620.

In step S670, the control unit 130 determines whether the third index j is equal to n. When a value of the step S670 is "No", step S680 is performed.

In step S680, the control unit 130 increases the third index j by 1, and sets the fourth index i to 1. After the step S680, the process returns to the step S620.

The value of the step S650 being "Yes" indicates that the setting of the valid external variable for the $j^{th}$ internal variable is completed. Each time the value of the step S650 is "Yes", the control unit 130 may generate the $j^{th}$ sub-multilayer perceptron used to estimate the value of the $j^{th}$ internal variable.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A battery management apparatus for use with a battery cell, comprising:
    a memory configured to store a first to a $p^{th}$ observational data sets and a first to an $n^{th}$ desired data sets, wherein each of the p and the n is an integer equal to 2 or greater, the first to the $p^{th}$ observational data sets are respectively associated with p external variables that are observable outside the battery cell, and the p in the p external variables is the same integer as the p in the first to the $p^{th}$ observational data set;
    a control circuit operably coupled to the memory;
    a sensing circuit operably coupled to the control circuit and configured to measure a sensing data for the battery cell associated with at least one of the p external variables and to provide the sensing data to the control circuit; and a switch coupled between a positive terminal of the battery cell and a positive power terminal or between a negative terminal of the battery cell and a negative power terminal, wherein each of the first to the $p^{th}$ observational data sets includes a predetermined number of input values, wherein the first to the $n^{th}$ desired data sets are associated with a first to an $n^{th}$ internal variables, respectively, wherein the first to the $n^{th}$ internal variables are dependent on an internal chemical state of the battery cell and unobservable outside the battery cell, and the n in the first to the $n^{th}$ internal variables is the same integer as the n in the first to the $n^{th}$ desired data sets, wherein each of the first to the $n^{th}$ desired data sets includes the same number of target values as the predetermined number of input values, and wherein the control circuit is configured to:

set m observational data sets extracted by data filtering from the first to the $p^{th}$ observational data sets as a first to an $m^{th}$ input data sets, wherein the m in the m observational data sets and the m in the first to the $m^{th}$ input data sets are a same integer greater than or equal to 1 and smaller than or equal to the p, and set at least one of a first to an $m^{th}$ external variables, among the p external variables, as a valid external variable for each of the first to the $n^{th}$ internal variables based on the first to the $m^{th}$ input data sets and the first to the $n^{th}$ desired data sets, the m in the first to the $m^{th}$ external variables being the same integer as the m in the m observational data sets, wherein the first to the $m^{th}$ external variables, among the p external variables, are associated with the m observational data sets, and wherein the control circuit is further configured to determine a value of the at least one of the p external variables based on the sensing data, to determine an estimated value of at least one of the first to the $n^{th}$ internal variables based on the value of the at least one of the p external variables, and to control the switch into an open or closed operating state to control charging or discharging of the battery cell based on whether the estimated value of the at least one of the first to the $n^{th}$ internal variables is outside a predetermined safety range.

2. The battery management apparatus according to claim 1, wherein the control circuit is further configured to:

determine a multiple correlation coefficient between a $q^{th}$ observational data set and a $(q+1)$th observational data set, where the q in the $q^{th}$ observational data set is a same integer greater than or equal to 1 and smaller than or equal to p−1 as the q in the $(q+1)$th observational data set, and set the $q^{th}$ observational data set as one of the first to the $m^{th}$ input data sets if an absolute value of the multiple correlation coefficient is less than a predetermined filtering value.

3. The battery management apparatus according to claim 1, wherein the memory is further configured to store a main multilayer perceptron that defines a correspondence relationship between the first to the $m^{th}$ external variables and the first to the $n^{th}$ internal variables, wherein the control circuit is further configured to:

acquire a first to an $n^{th}$ output data sets from a first to an $n^{th}$ output nodes included in an output layer of the main multilayer perceptron by providing the first to the $m^{th}$ input data sets to a first to an $m^{th}$ input nodes included in an input layer of the main multilayer perceptron, each of the first to the $n^{th}$ output data sets including the same number of result values as the predetermined number, determine a first to an $n^{th}$ error factors based on the first to the $n^{th}$ output data sets and the first to the $n^{th}$ desired data sets, and determine a first to an $n^{th}$ reference values by comparing each of the first to the $n^{th}$ error factors with a threshold error factor, wherein the n in the first to the $n^{th}$ output data sets, the n in the first to the $n^{th}$ output nodes, the n in the first to the $n^{th}$ error factors, and the n in the first to the $n^{th}$ reference values are the same integer as the n in the first to the $n^{th}$ desired data sets, and wherein the m in the first to the $m^{th}$ input nodes is the same integer as the m in the first to the $m^{th}$ input data sets.

4. The battery management apparatus according to claim 3, wherein the control circuit is further configured to determine a $j^{th}$ error factor to be equal to an error ratio of a $j^{th}$ output data set to a $j^{th}$ desired data set, where the j in the $j^{th}$ error factor, the j in the $j^{th}$ output data, and the j in the $j^{th}$ desired data set are a same integer greater than or equal to 1 and smaller than or equal to the n.

5. The battery management apparatus according to claim 4, wherein the control circuit is further configured to set a $j^{th}$ reference value to be equal to a first predetermined value if the $j^{th}$ error factor is smaller than the threshold error factor, and wherein the j in the $j^{th}$ reference value is the same integer as the j in the $j^{th}$ error factor.

6. The battery management apparatus according to claim 5, wherein the control circuit is further configured to set the $j^{th}$ reference value to be equal to a second predetermined value if the $j^{th}$ error factor is equal to or larger than the threshold error factor, and wherein the second predetermined value is smaller than the first predetermined value.

7. The battery management apparatus according to claim 3, wherein the control circuit is further configured to:

determine whether to set an $i^{th}$ external variable among the first to the $m^{th}$ external variables as a valid external variable for a $j^{th}$ internal variable based on an $i^{th}$ input data set, a $j^{th}$ desired data set and a $j^{th}$ reference value, where the i in the $i^{th}$ internal variable and the i in the $i^{th}$ input data are a same integer greater than or equal to 1 and smaller than or equal to the m, and the j in the $j^{th}$ internal variable, the j in the $j^{th}$ desired data set, and the j in the $j^{th}$ reference value set are a same integer greater than or equal to 1 and smaller than or equal to the n, and learn a sub-multilayer perceptron associated with the $j^{th}$ internal variable using the $i^{th}$ input data set as training data when the $i^{th}$ external variable is set as the valid external variable for the $j^{th}$ internal variable.

8. The battery management apparatus according to claim 7, wherein the control circuit is further configured to:

determine a multiple correlation coefficient between the $i^{th}$ input data set and the $j^{th}$ desired data set, and set the $i^{th}$ external variable as the valid external variable for the $j^{th}$ internal variable if an absolute value of the multiple correlation coefficient is larger than the $j^{th}$ reference value.

9. The battery management apparatus according to claim 8, wherein the control circuit is further configured to set the $i^{th}$ external variable as an invalid external variable for the $j^{th}$ internal variable if the absolute value of the multiple correlation coefficient is equal to or less than the $j^{th}$ reference value.

10. A battery pack comprising the battery management apparatus according to claim 1 and the battery cell.

11. A battery management method for use with a battery cell connected between a positive power terminal and a negative power terminal via a switch, comprising:

storing a first to a $p^{th}$ observational data sets and a first to an $n^{th}$ desired data sets in a memory, wherein:

each of the p and the n is an integer equal to 2 or greater, the first to the $p^{th}$ observational data sets are respectively associated with p external variables that are observable outside the battery cell, the p in the p external variables being the same integer as the p in the first to the $p^{th}$ observational data set, each of the first to the $p^{th}$ observational data sets includes a predetermined number of input values, the first to the $n^{th}$ desired data sets are respectively associated with a first to an $n^{th}$ internal variables that are unobservable outside the battery cell, the first to the $n^{th}$ internal variables being dependent on an internal chemical state of the battery cell, and the n in the first to the $n^{th}$ internal variables being the same integer as the n in the first to the $n^{th}$ desired data sets, and each of the first to the $n^{th}$ desired data sets includes the same number of target values as the predetermined number of input values;

setting m observational data sets extracted by data filtering from the first to the $p^{th}$ observational data sets as a first to an $m^{th}$ input data sets, wherein the m in the m observational data sets and the m in the first to the $m^{th}$ input data sets are a same integer greater than or equal to 1 and smaller than or equal to the p;

setting at least one of a first to an $m^{th}$ external variables, among the p external variables, as a valid external variable for each of the first to the $n^{th}$ internal variables based on the first to the $m^{th}$ input data sets and the first to the $n^{th}$ desired data sets, the m in the first to the $m^{th}$ external variables being the same integer as the m in the m observational data sets;

measuring a sensing data for the battery cell associated with at least one of the p external variables;

determining a value of the at least one of the p external variables based on the sensing data;

determining an estimated value of at least one of the first to the $n^{th}$ internal variables based on the value of the at least one of the p external variables; and controlling the switch into an open or closed operating state to control charging or discharging of the battery cell based on whether the estimated value of the at least one of the first to the $n^{th}$ internal variables is outside a predetermined safety range, wherein the first to the $m^{th}$ external variables, among the first to the $p^{th}$ external variables, are associated with the m observational data sets.

12. The battery management method according to claim 11, wherein setting the m observational data sets as the first to the $m^{th}$ input data sets comprises:

determining a multiple correlation coefficient between a $q^{th}$ observational data set and a (q+1)th observational data set, where the q in the $q^{th}$ observational data set is a same integer greater than or equal to 1 and smaller than or equal to p−1 as the q in the (q+1)th observational data set; and setting the $q^{th}$ observational data set as one of the first to the $m^{th}$ input data sets if an absolute value of the multiple correlation coefficient is less than a predetermined filtering value.

13. The battery management apparatus according to claim 1, further comprising:

an interface operably coupled to the control circuit and configured to support a communication between the control circuit and an external device.

14. The battery management apparatus according to claim 13, wherein the interface includes at least one of a display, a speaker, a mouse, and a keyboard to provide or receive data from a user, and wherein the external device is one of an electrical load, a direct current (DC) to alternating current (AC) inverter, and a charger of an electric vehicle.

15. The battery management apparatus according to claim 1, wherein the sensing data includes at least one of a voltage, a current, and a temperature of the battery cell.

16. The battery management apparatus according to claim 1, wherein the control circuit is further configured to control the switch into the open operating state to stop charging or discharging the battery if the estimated value of the at least one of the first to the $n^{th}$ internal variables is outside the predetermined safety range.

17. The battery management method according to claim 11, wherein the sensing data includes at least one of a voltage, a current, and a temperature of the battery cell.

18. The battery management method according to claim 11, wherein the controlling of the switch includes controlling the switch into the open operating state to stop charging or discharging the battery cell if the estimated value of the at least one of the first to the $n^{th}$ internal variables is outside the predetermined safety range.

\* \* \* \* \*